US008381159B2

(12) United States Patent
Kondou et al.

(10) Patent No.: US 8,381,159 B2
(45) Date of Patent: Feb. 19, 2013

(54) METHOD OF SEMICONDUCTOR INTEGRATED CIRCUIT, AND COMPUTER READABLE MEDIUM

(75) Inventors: Keiichirou Kondou, Kanagawa (JP); Hiroyuki Tsuchiya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 147 days.

(21) Appl. No.: 12/978,307

(22) Filed: Dec. 23, 2010

(65) Prior Publication Data
US 2011/0161904 A1  Jun. 30, 2011

(30) Foreign Application Priority Data
Dec. 24, 2009 (JP) ................... 2009-292712

(51) Int. Cl.
G06F 17/50 (2006.01)
G06F 9/455 (2006.01)
(52) U.S. Cl. ............... 716/114; 716/113
(58) Field of Classification Search .......... 716/114, 716/113
See application file for complete search history.

(56) References Cited

U.S. PATENT DOCUMENTS

| 5,974,245 | A * | 10/1999 | Li et al. ........................... 716/55 |
| 6,367,051 | B1 * | 4/2002 | Pileggi et al. .................. 716/114 |
| 6,487,697 | B1 * | 11/2002 | Lu et al. .......................... 716/114 |
| 6,505,336 | B1 * | 1/2003 | Andreev et al. ................. 716/114 |
| 6,510,542 | B1 * | 1/2003 | Kojima ........................... 716/114 |
| 6,532,580 | B1 * | 3/2003 | Josephson et al. ............. 716/114 |
| 6,615,401 | B1 * | 9/2003 | Gasanov et al. ............... 716/114 |
| 6,826,740 | B2 * | 11/2004 | Drumm .......................... 716/114 |
| 7,676,780 | B2 * | 3/2010 | Alpert et al. ................... 716/114 |
| 7,827,513 | B2 * | 11/2010 | Palumbo et al. ............... 716/122 |
| 2003/0221176 | A1 * | 11/2003 | Andreev et al. ................... 716/7 |
| 2005/0138578 | A1 * | 6/2005 | Alpert et al. ..................... 716/2 |
| 2006/0043427 | A1 | 3/2006 | Komoda et al. |
| 2010/0287516 | A1 * | 11/2010 | Chowdhury ....................... 716/6 |

FOREIGN PATENT DOCUMENTS

JP  2006-065669 A  3/2006

* cited by examiner

Primary Examiner — Stacy Whitmore
Assistant Examiner — Magid Dimyan
(74) Attorney, Agent, or Firm — Sughrue Mion, PLLC

(57) ABSTRACT

A design method of a semiconductor integrated circuit sets an area having apices of opposing corners of a position of a start point logic cell and a position of an end point logic cell to a repeater search area, adds free area information to the repeater search area, sets a drive boundary in the repeater search area based on a drive ability of the start point logic cell, searches a repeater candidate that can be arranged in an area of the drive boundary based on the free area information, calculates a delay time from the start point logic cell to the end point logic cell based on delay time information and a coordinate of the repeater candidate that is searched, and determines a repeater arranged between the start point logic cell and the end point logic cell from the repeater candidate based on the delay time that is calculated.

15 Claims, 14 Drawing Sheets

|   | a | b | c | d | e | f | g | h | i | j |
|---|---|---|---|---|---|---|---|---|---|---|
| A | 5 | 5 | 5 | 5 | 4 | 5 | 5 | 5 | 5 | 1 |
| B | 5 | 5 | 3 | 0 | 0 | 0 | 0 | 0 | 0 | 0 |
| C | 5 | 5 | 5 | 2 | 0 | 0 | 0 | 0 | 0 | 0 |
| D | 0 | 0 | 0 | 0 | 0 | 0 | 0 | 0 | 0 | 0 |
| E | 0 | 0 | 0 | 0 | 0 | 0 | 0 | 0 | 0 | 0 |
| F | 0 | 0 | 0 | 0 | 0 | 0 | 0 | 0 | 0 | 0 |
| G | 0 | 0 | 0 | 0 | 0 | 0 | 0 | 0 | 0 | 0 |
| H | 0 | 0 | 0 | 0 | 0 | 0 | 0 | 0 | 0 | 0 |
| I | 0 | 0 | 0 | 0 | 0 | 0 | 0 | 0 | 5 | 5 |
| J | 0 | 0 | 0 | 0 | 0 | 2 | 0 | 0 | 0 | 4 |
| K | 1 | 0 | 0 | 0 | 0 | 0 | 0 | 0 | 4 | 5 |

Fig. 3

|   | a | b | c | d | e | f | g | h | i | j |
|---|---|---|---|---|---|---|---|---|---|---|
| A | 5 | 5 | 5 | 5 | 4 | 5 | 5 | 5 | 5 | 1 |
| B | 5 | 5 | 3 | 0 | 0 | 0 | 0 | 0 | 0 | 0 |
| C | 5 | 5 | 5 | 2 | 0 | 0 | 0 | 0 | 0 | 0 |
| D | 0 | 0 | 0 | 0 | 0 | 0 | 0 | 0 | 0 | 0 |
| E | 0 | 0 | 0 | 0 | 0 | 0 | 0 | 0 | 0 | 0 |
| F | 0 | 0 | 0 | 0 | 0 | 0 | 0 | 0 | 0 | 0 |
| G | 0 | 0 | 0 | 0 | 0 | 0 | 0 | 0 | 0 | 0 |
| H | 0 | 0 | 0 | 0 | 0 | 0 | 0 | 0 | 0 | 0 |
| I | 0 | 0 | 0 | 0 | 0 | 0 | 0 | 0 | 5 | 5 |
| J | 0 | 0 | 0 | 0 | 0 | 0 | 2 | 0 | 0 | 4 |
| K | 1 | 0 | 0 | 0 | 0 | 0 | 0 | 0 | 4 | 5 |

Fig. 4

|   | a | b | c | d | e | f | g | h | i | j |
|---|---|---|---|---|---|---|---|---|---|---|
| A | 5 | 5 | 5 | 5 | 4 | 5 | 5 | 5 | 5 | 1 |
| B | 5 | 5 | 3 | 0 | 0 | 0 | 0 | 0 | 0 | 0 |
| C | 5 | 5 | 5 | 2 | 0 | 0 | 0 | 0 | 0 | 0 |
| D | 0 | 0 | 0 | 0 | 0 | 0 | 0 | 0 | 0 | 0 |
| E | 0 | 0 | 0 | 0 | 0 | 0 | 0 | 0 | 0 | 0 |
| F | 0 | 0 | 0 | 0 | 0 | 0 | 0 | 0 | 0 | 0 |
| G | 0 | 0 | 0 | 0 | 0 | 0 | 0 | 0 | 0 | 0 |
| H | 0 | 0 | 0 | 0 | 0 | 0 | 0 | 0 | 0 | 0 |
| I | 0 | 0 | 0 | 0 | 0 | 0 | 0 | 0 | 5 | 5 |
| J | 0 | 0 | 0 | 0 | 0 | 2 | 0 | 0 | 0 | 4 |
| K | 1 | 0 | 0 | 0 | 0 | 0 | 0 | 0 | 4 | 5 |

Fig. 5

|   | a | b | c | d | e | f | g | h | i | j |
|---|---|---|---|---|---|---|---|---|---|---|
| A | 5 | 5 | 5 | 5 | 4 | 5 | 5 | 5 | 5 | 1 |
| B | 5 | 5 | 3 | 0 | 0 | 0 | 0 | 0 | 0 | 0 |
| C | 5 | 5 | 5 | 2 | 0 | 0 | 0 | 0 | 0 | 0 |
| D | 0 | 0 | 0 | 0 | 0 | 0 | 0 | 0 | 0 | 0 |
| E | 0 | 0 | 0 | 0 | 0 | 0 | 0 | 0 | 0 | 0 |
| F | 0 | 0 | 0 | 0 | 0 | 0 | 0 | 0 | 0 | 0 |
| G | 0 | 0 | 0 | 0 | 0 | 0 | 0 | 0 | 0 | 0 |
| H | 0 | 0 | 0 | 0 | 0 | 0 | 0 | 0 | 0 | 0 |
| I | 0 | 0 | 0 | 0 | 0 | 0 | 0 | 0 | 5 | 5 |
| J | 0 | 0 | 0 | 0 | 0 | 2 | 0 | 0 | 0 | 4 |
| K | 1 | 0 | 0 | 0 | 0 | 0 | 0 | 0 | 4 | 5 |

Fig. 6

|   | a | b | c | d | e | f | g | h | i | j |
|---|---|---|---|---|---|---|---|---|---|---|
| A | 5 | 5 | 5 | 5 | 4 | 5 | 5 | 5 | 5 | 1 |
| B | 5 | 5 | 3 | 0 | 0 | 0 | 0 | 0 | 0 | 0 |
| C | 5 | 5 | 5 | 2 | 0 | 0 | 0 | 0 | 0 | 0 |
| D | 0 | 0 | 0 | 0 | 0 | 0 | 0 | 0 | 0 | 0 |
| E | 0 | 0 | 0 | 0 | 0 | 0 | 0 | 0 | 0 | 0 |
| F | 0 | 0 | 0 | 0 | 0 | 0 | 0 | 0 | 0 | 0 |
| G | 0 | 0 | 0 | 0 | 0 | 0 | 0 | 0 | 0 | 0 |
| H | 0 | 0 | 0 | 0 | 0 | 0 | 0 | 0 | 0 | 0 |
| I | 0 | 0 | 0 | 0 | 0 | 0 | 0 | 0 | 5 | 5 |
| J | 0 | 0 | 0 | 0 | 0 | 2 | 0 | 0 | 0 | 4 |
| K | 1 | 0 | 0 | 0 | 0 | 0 | 0 | 0 | 4 | 5 |

Fig. 7

|   | a | b | c | d | e | f | g | h | i | j | k | l |
|---|---|---|---|---|---|---|---|---|---|---|---|---|
| A | 5 | 5 | 5 | 5 | 5 | 5 | 5 | 5 | 5 | 5 | 5 | 5 |
| B | 5 | 5 | 5 | 5 | 5 | 4 | 5 | 5 | 5 | 5 | 1 | 5 |
| C | 5 | 5 | 5 | 3 | 0 | 0 | 0 | 0 | 0 | 0 | 0 | 0 |
| D | 5 | 5 | 5 | 5 | 2 | 0 | 0 | 0 | 0 | 0 | 0 | 0 |
| E | 0 | 0 | 0 | 0 | 0 | 0 | 0 | 0 | 0 | 0 | 0 | 0 |
| F | 0 | 0 | 0 | 0 | 0 | 0 | 0 | 0 | 0 | 0 | 0 | 0 |
| G | 0 | 0 | 0 | 0 | 0 | 0 | 0 | 0 | 0 | 0 | 0 | 0 |
| H | 0 | 0 | 0 | 0 | 0 | 0 | 0 | 0 | 0 | 0 | 0 | 0 |
| I | 0 | 0 | 0 | 0 | 0 | 0 | 0 | 0 | 0 | 0 | 0 | 0 |
| J | 0 | 0 | 0 | 0 | 0 | 0 | 0 | 0 | 0 | 5 | 5 | 5 |
| K | 0 | 1 | 0 | 0 | 0 | 0 | 2 | 0 | 0 | 0 | 4 | 5 |
| L | 0 | 1 | 0 | 0 | 0 | 0 | 0 | 0 | 0 | 4 | 5 | 5 |
| M | 0 | 0 | 0 | 0 | 0 | 0 | 8 | 0 | 0 | 0 | 0 | 0 |

Fig. 11

|   | a | b | c | d | e | f | g | h | i | j | k | l |
|---|---|---|---|---|---|---|---|---|---|---|---|---|
| A | 5 | 5 | 5 | 5 | 5 | 5 | 5 | 5 | 5 | 5 | 5 | 5 |
| B | 5 | 5 | 5 | 5 | 5 | 4 | 5 | 5 | 5 | 5 | 1 | 5 |
| C | 5 | 5 | 5 | 3 | 0 | 0 | 0 | 0 | 0 | 0 | 0 | 0 |
| D | 5 | 5 | 5 | 5 | 2 | 0 | 0 | 0 | 0 | 0 | 0 | 0 |
| E | 0 | 0 | 0 | 0 | 0 | 0 | 0 | 0 | 0 | 0 | 0 | 0 |
| F | 0 | 0 | 0 | 0 | 0 | 0 | 0 | 0 | 0 | 0 | 0 | 0 |
| G | 0 | 0 | 0 | 0 | 0 | 0 | 0 | 0 | 0 | 0 | 0 | 0 |
| H | 0 | 0 | 0 | 0 | 0 | 0 | 0 | 0 | 0 | 0 | 0 | 0 |
| I | 0 | 0 | 0 | 0 | 0 | 0 | 0 | 0 | 0 | 0 | 0 | 0 |
| J | 0 | 0 | 0 | 0 | 0 | 0 | 0 | 0 | 0 | 5 | 5 | 5 |
| K | 0 | 1 | 0 | 0 | 0 | 0 | 2 | 0 | 0 | 0 | 4 | 5 |
| L | 0 | 1 | 0 | 0 | 0 | 0 | 0 | 0 | 0 | 4 | 5 | 5 |
| M | 0 | 0 | 0 | 0 | 0 | 0 | 8 | 0 | 0 | 0 | 0 | 0 |
| N | 0 | 0 | 0 | 0 | 0 | 0 | 0 | 0 | 0 | 0 | 0 | 0 |

Fig. 12

METHOD OF SEMICONDUCTOR INTEGRATED CIRCUIT, AND COMPUTER READABLE MEDIUM

INCORPORATION BY REFERENCE

This application is based upon and claims the benefit of priority from Japanese patent application No. 2009-292712, filed on Dec. 24, 2009, the disclosure of which is incorporated herein in its entirety by reference.

BACKGROUND

1. Field of the Invention

The present invention relates to a design method of a semiconductor integrated circuit, and a computer readable medium, and more particularly, to a design method of a semiconductor integrated circuit and a computer readable medium that optimize the layout of the semiconductor integrated circuit.

2. Description of Related Art

There has been an increasing demand for an increase in a speed of a semiconductor integrated circuit including a system on chip (SoC) due to an increase in a speed of systems mounted thereon and an increase in a macro size as a result of complicated functions. To meet this demand, a logic synthesis method and an arrangement/wiring design method using various high-speed circuit technologies have been developed.

An increase in functional macros in a semiconductor integrated circuit results in an increase in a size of the semiconductor integrated circuit and an increase in the length of a signal wiring passing through the functional macros, which increases the wiring delay. Thus, it becomes difficult to achieve high-speed operation in the semiconductor integrated circuit. One method that is typically used to reduce the influence of wiring capacitance components caused due to the increase in the length of the signal wiring is to insert a buffer logic cell that is able to be sufficiently driven and inverter logic cells formed of even number of stages (hereinafter referred to as repeaters) into the semiconductor integrated circuit, so as to reduce the wiring delay. In this case, a certain time is required to correct bypass wiring in order to change the repeater arrangement position. Thus, an efficient operation is required.

Japanese Unexamined Patent Application Publication No. 2006-65669 discloses a technique related to an automatic-arrangement-wiring apparatus in which layout design can be performed at an appropriate timing by one automatic-arrangement-wiring. The automatic-arrangement-wiring apparatus according to Japanese Unexamined Patent Application Publication No. 2006-65669 calculates the wiring length between functional macro cells or blocks using an existing technique such as a Manhattan distance, selects a wiring layer used according to the transfer rate required from the correlation between the transfer rate and the wiring length that are obtained, and inserts repeaters when the transfer rate does not satisfy the required value even when this wiring layer is used.

FIG. 13 is a block diagram showing a configuration of the automatic-arrangement-wiring apparatus according to Japanese Unexamined Patent Application Publication No. 2006-65669. As shown in FIG. 13, the automatic-arrangement-wiring apparatus according to Japanese Unexamined Patent Application Publication No. 2006-65669 includes a transfer rate and repeater-to-repeater distance determining unit 112, an arrangement processing unit 113, a wire-length estimating unit 114, a wire-length determining unit 115, a transfer rate calculating unit 116, a wiring layer assigning unit 117, a repeater inserting unit 118, a wiring processing unit 119, a timing verifying unit 120, and a drawing unit 121.

The transfer rate and repeater-to-repeater distance determining unit 112 acquires a relationship between a repeater-to-repeater distance and a transfer rate for each of a plurality of wiring layers having different time constants based on a relationship between the repeater-to-repeater distance and a delay time which is prepared beforehand for each of the plurality of wiring layers, and calculates the highest transfer rate for each of the plurality of wiring layers. Note that the transfer rate is the time required for signals to propagate over a unit length of the wiring layer connecting repeaters, and is therefore expressed in units of time per unit length. In accordance with the related art, high transfer rate indicates that the time required for signals to propagate over a unit distance of the wiring layer is short, whereas low transfer rate indicates long transfer time.

The delay time is the time required for signals to propagate between repeaters in the wiring layer, and the repeater-to-repeater distance is the wiring length between the repeaters in the wiring layer. In accordance with Japanese Unexamined Patent Application Publication No. 2006-65669, each delay of the repeaters is disregarded and the result of division of the delay time by the repeater-to-repeater distance is acquired as the transfer rate associated with this repeater-to-repeater distance.

FIG. 14 is a flow chart showing an operation of the automatic-arrangement-wiring apparatus according to Japanese Unexamined Patent Application Publication No. 2006-65669. The related art will be described with reference to this flow chart. First, before carrying out layout wiring, the transfer rate and repeater-to-repeater distance determining unit 112 reads electronic data stored in a hard disk device in advance indicating a relationship between the delay time and the repeater-to-repeater distance for each of a plurality of wiring layers to a RAM. The transfer rate and repeater-to-repeater distance determining unit 112 then calculates a transfer rate for each of the plurality of wiring layers from the relationship between the repeater-to-repeater distance and the delay time indicated by the electronic data, and acquires a relationship between the repeater-to-repeater distance and the transfer rate for each of the plurality of wiring layers. Then, the transfer rate and repeater-to-repeater distance determining unit 112 calculates the highest transfer rate for each of the plurality of wiring layers having different time constants from the relationship between the repeater-to-repeater distance and the transfer rate of each of the plurality of wiring layers. The above processing corresponds to step S101 shown in FIG. 14.

The arrangement processing unit 113 then carries out arrangement of blocks and macro cells using a netlist which defines a connection relationship among blocks and macro cells in each desired logical circuit (step S102 in FIG. 14). One of various types of known arrangement technologies can be used as this arrangement technique.

When the arrangement of blocks and macro cells is completed, the wire-length estimating unit 114 estimates the wiring length of each of wiring routes which are to be provided among the blocks and macro cells based on the results of the arrangement (step S103 in FIG. 14). Using a known technology such as a Manhattan distance or the like as a method of estimating the wiring length, the wire-length estimating unit 114 estimates the wiring length of each of the wiring routes (hereinafter referred to as estimated wiring length as appropriate) in consideration of the congestion degree and degree of difficulty of wiring according to the arrangement results.

When accepting information about the estimated wiring length from the wire-length estimating unit 114, the wire-length determining unit 115 compares this information about the estimated wiring length with information about the wiring length specified by a user, and determines whether or not the estimated wiring length is equal to or longer than the wiring length specified by the user (step S104 in FIG. 14). The wiring length specified by the user is a threshold of a wiring length which provides a maximum permissible delay time according to the specifications of the circuit design. The information of the wiring length specified by the user is input into the automatic-arrangement-wiring apparatus using an input device, e.g., a keyboard or a mouse.

In step S104 in FIG. 14, when the wiring length estimated by the wire-length estimating unit 114 is shorter than the wiring length specified by the user, the process shifts to wiring processing of step S108 in FIG. 14. On the other hand, when determining that the estimated wiring length is equal to or longer than the wiring length specified by the user, the wire-length estimating unit 114 outputs the fact that the estimated wiring length is equal to or longer than the wiring length specified by the user and the information about the estimated wiring length to the transfer rate calculating unit 116. The transfer rate calculating unit 116 then estimates a delay time which is required based on a timing value in the wiring length of each wiring route specified by the user to calculate a transfer rate (step S105 in FIG. 14).

The timing value specified by the user and provided to the wiring length of each wiring route is a timing limitation value for the wiring length of each wiring route in question which the user has specified according to the specifications of the circuit design. For example, the timing value can be a real wire capacitance. The timing value is input to the automatic-arrangement-wiring apparatus by using an input device, e.g., a keyboard or a mouse. The information about the transfer rate and delay time which are determined for the estimated wiring length of each wiring route which is determined to be equal to or longer than the wiring length specified by the user is output from the transfer rate calculating unit 116 to the wiring layer assigning unit 117.

The wiring layer assigning unit 117 then compares the transfer rate calculated by the transfer rate calculating unit 116 with the highest transfer rates each of which being predetermined for the plurality of wiring layers having different time constants, and selects and assigns a wiring layer having the lowest transfer rate from among wiring layers extracted in an area that does not exceed the transfer rate calculated by the transfer rate calculating unit 116 to each wiring route in question (step S106 in FIG. 14).

The repeater inserting unit 118 then uses the relationship between the repeater-to-repeater distance and the transfer rate which is predetermined by the transfer rate and repeater-to-repeater distance determining unit 112, so as to determine a repeater-to-repeater distance which minimizes the transfer rate of the wiring layer which is assigned to each wiring route in question by the wiring layer assigning unit 117. The repeater inserting unit 118 further compares the wiring length of the wiring layer with the repeater-to-repeater distance determined as mentioned above, and, when the wiring length of the wiring layer in question is longer than the determined repeater-to-repeater distance, inserts one or more repeaters, such as buffers, into each wiring route in question formed of the assigned wiring layer at intervals specified by the repeater-to-repeater distance (step S107 in FIG. 14).

When the wire-length determining unit 115, in step S104 in FIG. 14, determines that the estimated wiring length is shorter than the wiring length specified by the user, or when the processing up to above-mentioned step S107 in FIG. 14 is completed, the wiring processing unit 119 performs wiring processing on each of the plurality of wiring routes having an estimated wiring length, and also performs wiring processing on the wiring layer which is assigned to each wiring route by the wiring layer assigning unit 117 (in step S108 in FIG. 14). At this time, the automatic arrangement wiring apparatus performs this processing on the plurality of wiring routes in an increasing order of transfer rates required of wiring layers which are assigned to the plurality of wiring routes. As a result, wiring can be sequentially performed on the wiring layers in order of decreasing time constant and hence increasing transfer rate, but decreasing number of wiring resources. Thus, a fine wiring layer is wired first with the largest time constant and hence the lowest transfer rate, but the largest number of wiring resources. Therefore, automatic wiring with good efficiency in consideration of the wiring resources can be implemented.

The timing verifying unit 120 then performs timing verification on the automatically-arranged wiring layout which is thus obtained as mentioned above (in step S109 in FIG. 14), and determines whether timing error parts exist in the automatically-arranged wiring layout (in step S110 in FIG. 14). When determining that timing error parts exist in the automatically-arranged wiring layout, the process returns to step S106 in FIG. 14 in which it carries out the assignment of wiring layers to the plurality of wiring routes again.

For example, the wiring layer assigning unit 117 assigns a wiring layer having the second lowest transfer rate, which is selected from among wiring layers whose transfer rates do not exceed the transfer rate calculated by the transfer rate calculating unit 116 based on the relationship between the plurality of wiring layers and their lowest transfer rates, to each of the plurality of wiring routes. Then, wiring is sequentially performed on the wiring layers in order of decreasing time constant and hence increasing transfer rate, and decreasing number of wiring resources. Thus, a fine wiring layer is wired first. On the other hand, when determining that no timing error part exists in the automatically-arranged wiring layout, the timing verifying unit 120 notifies the drawing unit 121 of the fact. As a result, the drawing unit 121 displays the semiconductor layout created as mentioned above on a display screen of a computer device to provide it for a user.

In accordance with the automatic-arrangement-wiring apparatus disclosed in Japanese Unexamined Patent Application Publication No. 2006-65669, when acquiring the relationship between the repeater-to-repeater distance and the transfer rate for each of the plurality of wiring layers, the transfer rate and repeater-to-repeater distance determining unit 112 can provide an amount of displacement which serves as an arrangement margin from ideal positions which are determined beforehand in consideration of the fact that repeaters cannot be actually arranged at the ideal positions (step S101 in FIG. 14). As a result, when it is impossible to arrange them at the ideal positions when repeaters are actually arranged, the positions where they are to be arranged can be adjusted according to this amount of displacement.

For a certain wiring route to which a wiring layer is assigned, even if it is determined that the transfer rate is the highest in a repeater-to-repeater distance, there is a case where repeaters cannot be arranged at the ideal positions specified by the repeater-to-repeater distance in terms of the arrangement space. In this case, the transfer rate and repeater-to-repeater distance determining unit 112 can receive a user-specified amount of displacement via a graphic display device or the like, and add the user-specified amount of displacement input by the user to the above-mentioned repeater-to-repeater distance. In this case, since the delay time increases by only a time corresponding to the increase in the repeater-to-repeater distance from the ideal one, the automatic-arrangement-wiring apparatus selects a wiring layer having a shorter transfer rate according to the increase in the repeater-to-repeater distance from the ideal one. For example, the wire-length estimating unit 114 estimates the wiring length of each of the plurality of wiring routes again in consideration of the amount of displacement from the ideal positions, or the wiring layer assigning unit 117 can change the assignment of a wiring layer to each of the plurality of wiring routes.

SUMMARY

In the automatic-arrangement-wiring apparatus according to Japanese Unexamined Patent Application Publication No. 2006-65669, when it is judged that the transfer rate among blocks and macro cells does not satisfy a required value (step S110 in FIG. 14) by assigning the wiring layer (step S106 in FIG. 14), repeaters are inserted into a wiring route which is considered to be ideal in consideration of the distance between blocks and macro cells (step S107 in FIG. 14) for arrangement.

In the automatic-arrangement-wiring apparatus according to Japanese Unexamined Patent Application Publication No. 2006-65669, when a large macro cell is already arranged in a position where the repeater that is inserted is arranged, an amount of arrangement displacement is set in advance when the repeater is arranged in consideration that the repeater that is inserted cannot be arranged (step S102 in FIG. 14). Hence, the position where the repeater can be arranged is concentrically searched to arrange the repeater on the wiring route which is considered to be ideal in consideration of the distance between blocks and macro cells.

In this case, the repeater is arranged in the position apart from the wiring route which is considered to be ideal in consideration of the distance between blocks and macro cells, and the wiring is bypassed. Accordingly, it is impossible to satisfy the transfer rate that is required, and timing error occurs in the timing verification (step S109 in FIG. 14). In this case, the processing goes back to the assignment of the wiring layer (step S106 in FIG. 14) to repeat the process.

More specifically, according to the automatic-arrangement-wiring apparatus in Japanese Unexamined Patent Application Publication No. 2006-65669, the signal wiring is not arranged to be the shortest from the start point to the end point. Thus, a bypass route of a redundant signal wiring is generated and the signal wiring is increased, which increases the wiring delay. Hence, the wiring delay cannot be within the transfer rate that is required and timing error is occurred, so that the assignment of the wiring layer and inserting of the repeater need to be repeated.

A first exemplary aspect of an embodiment of the present invention is a design method of a semiconductor integrated circuit for arranging a repeater between a start point logic cell and an end point logic cell, the method including: setting an area having apices of opposing corners of a position of the start point logic cell and a position of the end point logic cell to a repeater search area; adding free area information of a free area where a repeater can be arranged to the repeater search area; setting a drive boundary in the repeater search area based on a drive ability of the start point logic cell, the drive boundary being a boundary of an area in which the start point logic cell is able to drive a wiring load; searching a repeater candidate that can be arranged in an area of the drive boundary based on the free area information; calculating a delay time from the start point logic cell to the end point logic cell based on delay time information and a coordinate of the repeater candidate that is searched; and determining a repeater arranged between the start point logic cell and the end point logic cell from the repeater candidate based on the delay time that is calculated.

In the design method of the semiconductor integrated circuit according to the present invention, the area having apices of opposing corners of the position of the start point logic cell and the position of the end point logic cell is set to the repeater search area, and the repeater candidate is searched within this area. Accordingly, the repeater can be arranged in a position to make the signal wiring route between the start point logic cell and the end point logic cell the shortest, thereby suppressing an increase in the wiring delay and an occurrence of a timing error.

A second exemplary aspect of an embodiment of the present invention is a non-transitory computer readable medium that stores a program to cause a computer to execute processing of arranging a repeater between a start point logic cell and an end point logic cell, including: setting an area having apices of opposing corners of a position of the start point logic cell and a position of the end point logic cell to a repeater search area; adding free area information of a free area where a repeater can be arranged to the repeater search area; setting a drive boundary in the repeater search area based on a drive ability of the start point logic cell, the drive boundary being a boundary of an area in which the start point logic cell is able to drive a wiring load; searching a repeater candidate that can be arranged in an area of the drive boundary based on the free area information; calculating a delay time from the start point logic cell to the end point logic cell based on delay time information and a coordinate of the repeater candidate that is searched; and determining a repeater arranged between the start point logic cell and the end point logic cell from the repeater candidate based on the delay time that is calculated.

In the circuit design program according to the present invention, the area having apices of opposing corners of the position of the start point logic cell and the position of the end point logic cell is set to the repeater search area, the drive boundary is set based on the drive ability of the start point logic cell, and the repeater candidate is searched within this area. Accordingly, the repeater can be arranged in a position to make the signal wiring route between the start point logic cell and the end point logic cell the shortest, thereby making it possible to suppress an increase in the wiring delay and an occurrence of a timing error.

The present invention provides a design method of a semiconductor integrated circuit and a computer readable medium which are able to suppress an increase in a wiring delay and an occurrence of a timing error.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 3 is a diagram for describing a case in which a repeater arrangement possible area is extracted using the design method of the semiconductor integrated circuit according to the first exemplary embodiment;

FIG. 4 is a diagram for describing a case in which a repeater arrangement possible area is extracted using the design method of the semiconductor integrated circuit according to the first exemplary embodiment;

FIG. 5 is a diagram for describing a case in which a repeater arrangement possible area is extracted using the design method of the semiconductor integrated circuit according to the first exemplary embodiment;

FIG. 6 is a diagram for describing a case in which a repeater arrangement possible area is extracted using the design method of the semiconductor integrated circuit according to the first exemplary embodiment;

FIG. 7 is a diagram for describing a case in which a repeater arrangement possible area is extracted using the design method of the semiconductor integrated circuit according to the first exemplary embodiment;

FIG. 11 is a diagram for describing a case in which a repeater arrangement possible area is extracted using the design method of the semiconductor integrated circuit according to the second exemplary embodiment;

FIG. 12 is a diagram for describing a case in which a repeater arrangement possible area is extracted using the design method of the semiconductor integrated circuit according to the second exemplary embodiment;

DETAILED DESCRIPTION OF THE EXEMPLARY EMBODIMENTS

First Exemplary Embodiment

Hereinafter, a first exemplary embodiment of the present invention will be described with reference to the drawings.

Figure 2:
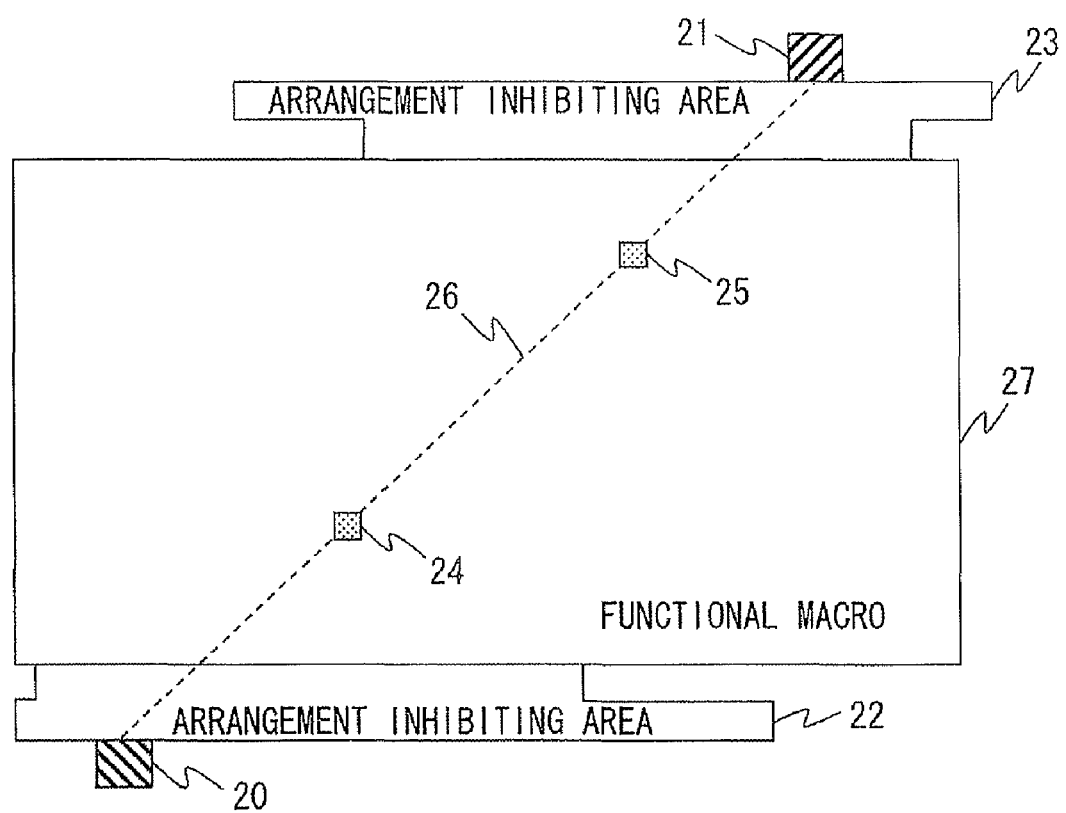
FIG. 2 is a diagram for describing the design method of the semiconductor integrated circuit according to the first exemplary embodiment.

FIG. 2 is a diagram for describing a design method of a semiconductor integrated circuit according to the first exemplary embodiment. FIG. 2 shows a state in which repeaters 24 and 25 are initially arranged so that a signal wiring image 26 that connects a start point logic cell 20 and an end point logic cell 21 becomes the shortest when the signal wiring image 26 passes on a functional macro 27 and arrangement inhibiting areas 22 and 23.

FIG. 3 is a diagram for describing a case in which a repeater arrangement possible area is extracted using the design method of the semiconductor integrated circuit according to the first exemplary embodiment. FIG. 3 shows a repeater arrangement possible area from the state in which the start point logic cell 20, the end point logic cell 21, the functional macro 27, and the arrangement inhibiting areas 22 and 23 shown in FIG. 2 are arranged.

Figure 8:
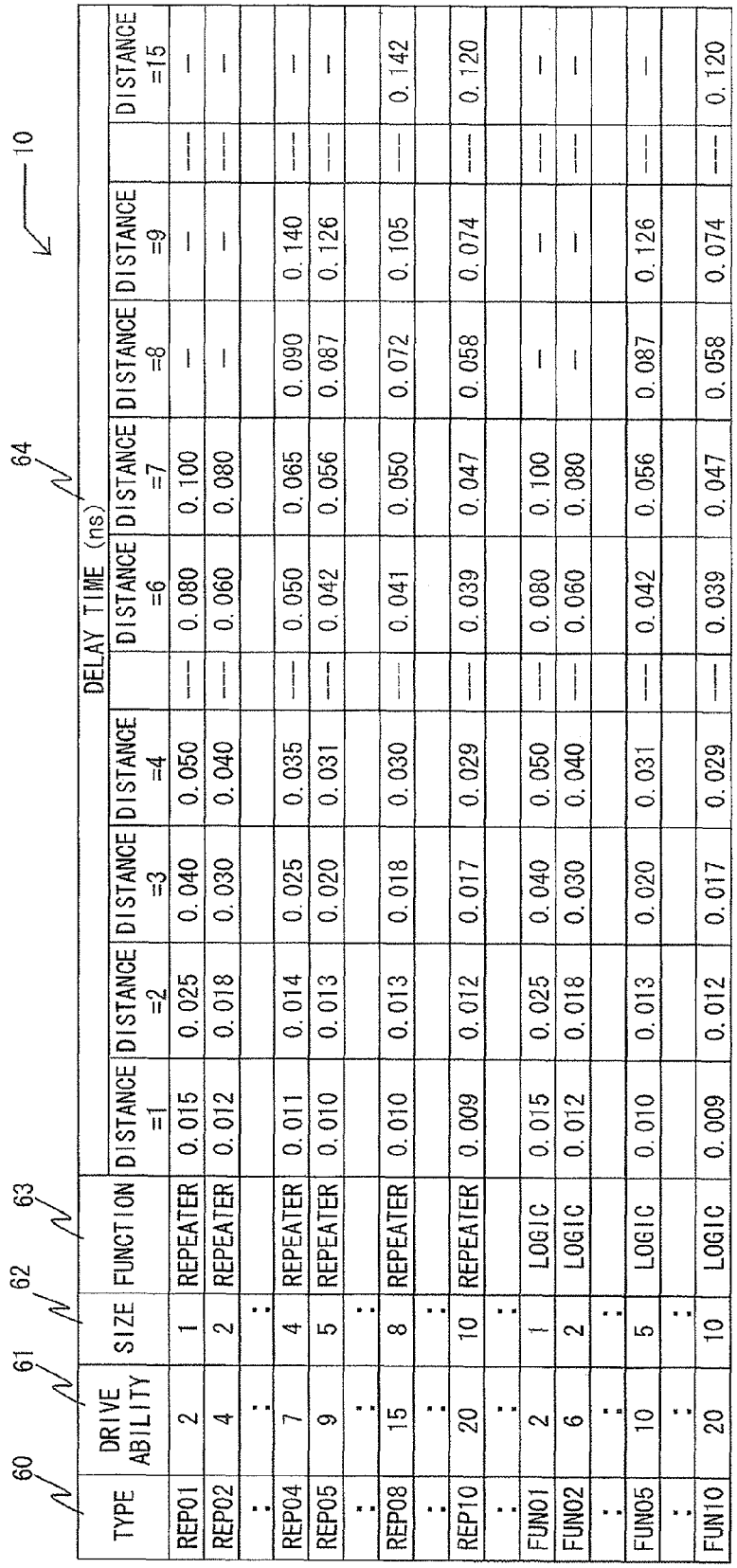
FIG. 8 is a diagram showing an example of a logic information table used in the design method of the semiconductor integrated circuit according to the first exemplary embodiment.

More specifically, in the design method of the semiconductor integrated circuit according to the first exemplary embodiment, as shown in FIG. 3, grids of A to K in the vertical direction and a to j in the horizontal direction are created in a lattice pattern, and free area information of a free area in which repeater candidates in a logic information table 10 shown in FIG. 8 can be arranged is indicated by a numeral for each grid.

Now, the logic information table 10 shown in FIG. 8 will be described. The logic information table 10 shown in FIG. 8 includes a logic cell type 60 indicating the type of a logic cell, a drive ability 61, a size 62, a logic cell/repeater discriminant 63 for judging a logic cell or a repeater, and a delay time 64 corresponding to a wiring distance.

The logic cell type 60 is a list of cells constituting the logic and used in a netlist, and is used as an index for extracting a position in which a repeater is arranged based on the drive ability 61, the size 62, the logic cell/repeater discriminant 63, and the delay time 64 of the logic cell extracted from the netlist.

The drive ability 61 indicates, when defining the minimum value of the ability to drive a wiring load (wiring capacitance load) as 1, how much wiring load corresponding to how many times of the minimum value of the drive ability can be driven. The size 62 indicates an area required for arranging the logic cell or the repeater. For example, the logic cell type REP02 indicates that the drive ability is "4" and the size is "2". The logic cell/repeater discriminant 63 is the information for judging whether the logic cell extracted from the netlist is the start/end point logic cell or the repeater. The delay time 64 is the value in which the delay time required to drive the wiring capacitance according to the wiring distance is represented by a numeral.

In the design method of the semiconductor integrated circuit according to the first exemplary embodiment, the repeater position is extracted in which the repeater arrangement is possible in an area surrounded by apices of opposing corners of a start point logic cell and an end point logic cell and the wiring to the end point is optimized based on the information stored in the logic information table 10.

The repeater arrangement possible area shown in FIG. 3 will be described again. Since no repeaters can be arranged in the functional macro 27 and the arrangement inhibiting area 22 shown in FIG. 2, the free area information of the grid is "0" in the repeater arrangement possible area shown in FIG. 3. Further, the size of one grid of grids forming the lattice pattern as shown in FIG. 3 is such that the repeater candidate of the maximum size can be arranged.

The numeral indicating the free area information in each grid is set by searching in the grid area if the repeater candidate of the logic cell/repeater discriminant 63 of the logic information table 10 can be arranged and setting the size of the repeater candidate that can be arranged as the free area information of the grid. The rectangular repeater search area (repeater search rectangular area, shown by dashed line) 30 is the area surrounded by the coordinate (a, K) and the coordinate (j, A) that are apices of opposing corners of the start point logic cell 20 and the end point logic cell 21. This repeater search area 30 is used to search the repeater candidate arrangement position in the area from the start point logic cell 20 to the end point logic cell 21.

A drive boundary 40 (shown by dotted line) indicates the area in which the start point logic cell 20 is able to drive the wiring load. The drive boundary 40 may be set by the following method. It is assumed, for example, that the logic of FUN02 shown in the logic information table 10 is arranged in the start point logic cell 20. In this case, since the drive ability of FUN02 is "6" as shown in the logic information table 10, FUN02 arranged in the start point logic cell 20 is capable of driving the wiring load of six grids. Accordingly, the boundary that connects the coordinate (g, K) and the coordinate (a, E) can be set to the drive boundary 40.

Specifically, the coordinate (g, K) is away from the coordinate (a, K) where the start point logic cell 20 is arranged by six grids in the horizontal axis direction within the repeater search area 30, and the coordinate (a, E) is away from the coordinate (a, K) by six grids in the vertical axis direction.

Further, a repeater candidate arrangement position 50 indicates that the repeater of the size "2" can be arranged. Now, the repeater candidate arrangement position 50 is within an area of the drive boundary 40, with the start point of the start point logic cell 20.

FIG. 4 is a diagram for describing a case in which the repeater arrangement possible area is extracted using the design method of the semiconductor integrated circuit according to the first exemplary embodiment, and shows a state in which a repeater candidate arrangement position 51 is in the coordinate (g, J). In the repeater arrangement possible area shown in FIG. 4, the drive boundary 40 which is the boundary in which the start point logic cell 20 is able to drive the wiring load described in FIG. 3 is enlarged by one grid in the side of the end point logic cell 21. In short, a drive boundary 41 (shown by dotted line) obtained by newly connecting the coordinate (h, K) and the coordinate (a, D) is reset. The drive boundary may be enlarged and reset as shown in FIG. 4 when there are no repeater candidates in the drive boundary before enlargement, for example.

FIG. 5 is a diagram for describing a case in which the repeater arrangement possible area is extracted using the design method of the semiconductor integrated circuit according to the first exemplary embodiment. FIG. 5 is a diagram of extracting a repeater search area (shown by dashed line) 31 from the repeater candidate arrangement position 50 obtained in FIG. 3 as the start point to the end point logic cell 21. In summary, the repeater search area 31 is an area surrounded by the coordinate (f, J) and the coordinate (j, A) which are apices of opposing corners of the repeater candidate arrangement position 50 and the end point logic cell 21. The repeater search area 31 sets the area that makes the route from the repeater candidate arrangement position 50 which is the start point to the end point logic cell 21 the shortest to the search area.

In the repeater candidate arrangement position 50, the repeater of REP02 having the size "2" is selected from the size 62 in the logic information table 10 and is arranged. Since the drive ability of the repeater of REP02 is "4", the boundary of the area in which the repeater of REP02 arranged in the repeater candidate arrangement position 50 is able to drive the wiring load can be indicated by a drive boundary 42 (shown by dotted line). In this case, the repeater candidate arrangement position is a repeater candidate arrangement position 52 and a repeater candidate arrangement position 53.

FIG. 6 is a diagram for describing a case in which a repeater arrangement possible area is extracted using the design method of the semiconductor integrated circuit according to the first exemplary embodiment. FIG. 6 is a diagram obtained by extracting a repeater search area (shown by dashed line) 32 from the repeater candidate arrangement position 52 obtained in FIG. 5 as the start point to the end point logic cell 21. In summary, the repeater search area 32 is an area surrounded by the coordinate (i, I) and the coordinate (j, A) which are apices of opposing corners of the repeater candidate arrangement position 52 and the end point logic cell 21. The repeater search area 32 sets the area that makes the route from the repeater candidate arrangement position 52 which is the start point to the end point logic cell 21 the shortest to the search area.

In the repeater candidate arrangement position 52, the repeater of REP05 having the size of "5" is selected from the size 62 in the logic information table 10 and is arranged. Since the repeater of REP05 has the drive ability of "9", the boundary of the area in which the repeater of REP05 arranged in the repeater candidate arrangement position 52 is able to drive the wiring load can be indicated by a drive boundary 43 (shown by dotted line). In this case, the limitation of the area that can be driven by the repeater of REP05 is the end point logic cell 21.

FIG. 7 is a diagram for describing a case in which the repeater arrangement possible area is extracted using the design method of the semiconductor integrated circuit according to the first exemplary embodiment. FIG. 7 is a diagram obtained by extracting a repeater search area (shown by dashed line) 33 from a repeater candidate arrangement position 53 obtained in FIG. 5 as the start point to the end point logic cell 21. In summary, the repeater search area 33 is an area that is surrounded by the coordinate (j, J) and the coordinate (j, A) which are apices of opposing corners of the repeater candidate arrangement position 53 and the end point logic cell 21. The repeater search area 33 sets the area that makes the route from the repeater candidate arrangement position which is the start point to the end point logic cell 21 the shortest to the search area.

In the repeater candidate arrangement position 53, the repeater of REP04 having the size of "4" is selected from the size 62 of the logic information table 10 and is arranged. The repeater of REP04 has the drive ability of "7". Accordingly, by widening the area in which the repeater of REP04 arranged in the repeater candidate arrangement position 53 is able to drive the wiring load on the side of the end point logic cell 21 by two grids, the boundary in the area in which the repeater of REP04 is able to drive the wiring load can be set to a drive boundary 44 (shown by dotted line). Thus, the limitation of the area that can be driven by the repeater of REP04 is the end point logic cell 21.

As described above, in the first exemplary embodiment, when repeaters are inserted between the start point logic cell 20 and the end point logic cell 21, REP02 can be inserted into the repeater candidate arrangement position 50 and REP05 can be inserted into the repeater candidate arrangement position 52 (see FIGS. 3, 5, and 6). Further, when repeaters are inserted between the start point logic cell 20 and the end point logic cell 21, REP02 can be inserted into the repeater candidate arrangement position 50, and REP04 can be inserted into the repeater candidate arrangement position 53 (see FIGS. 3, 5, and 7).

Figure 1:
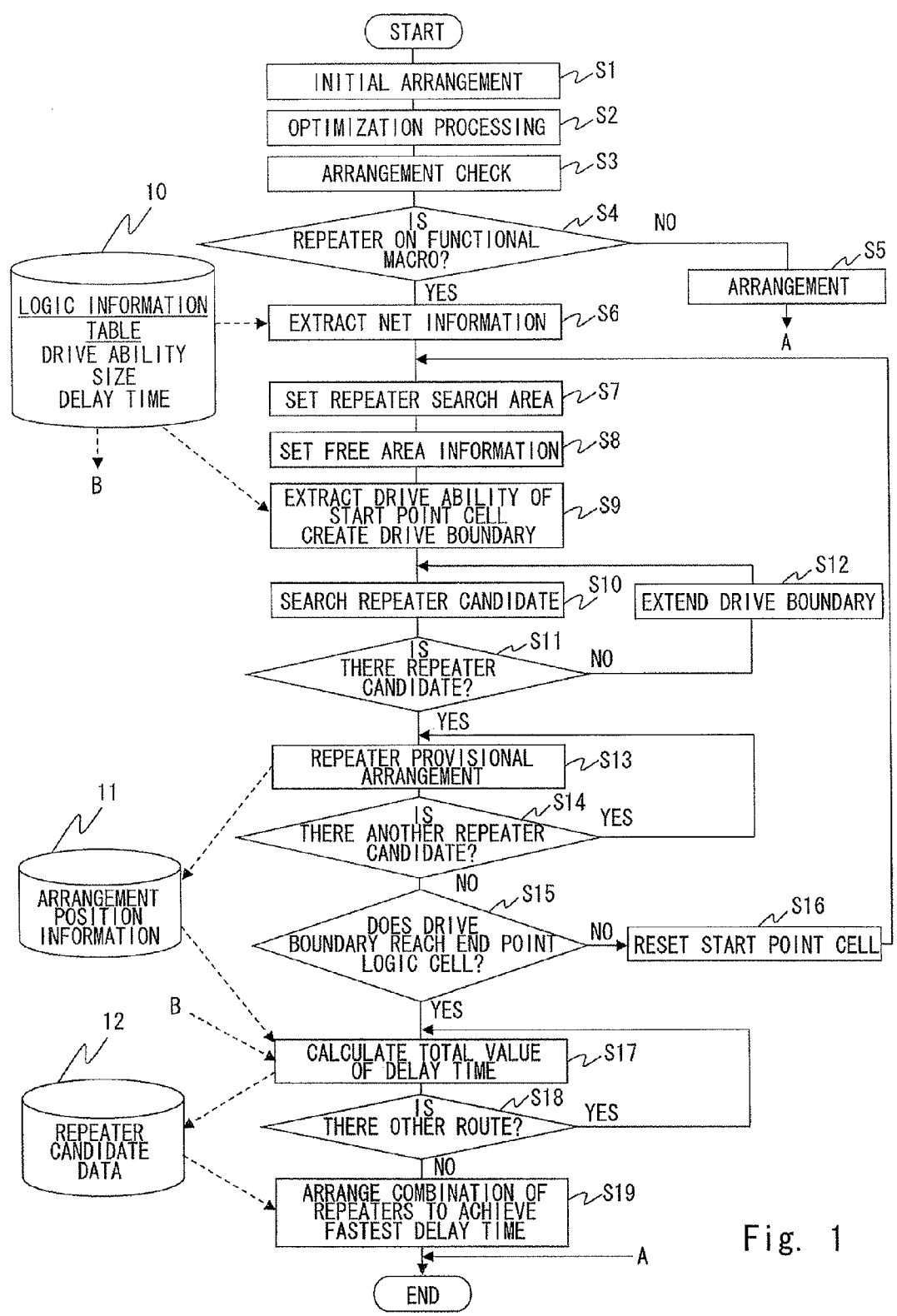
FIG. 1 is a flow chart for describing a design method of a semiconductor integrated circuit according to a first exemplary embodiment.

Next, a flow of the design method of the semiconductor integrated circuit according to the first exemplary embodiment will be described. FIG. 1 is a flow chart describing the design method of the semiconductor integrated circuit according to the first exemplary embodiment.

First, as shown in FIG. 1, the initial arrangement is performed only on a logic cell that exists on a netlist after reading the netlist (step S1). After the initial arrangement, optimization processing is performed including resizing to change the drive ability of the logic cell that is arranged, compressing the logic, and inserting a repeater between logic cells (step S2). As shown in FIG. 2, the repeaters 24 and 25 are in the provisionally-arranged state when the optimization processing is performed.

Next, arrangement check processing is performed to detect the provisionally-arranged repeater which is judged to be an arrangement error since the repeater overlaps with the functional macro 27 or the blocks (step S3). The following method can be used, for example, to detect the provisionally-arranged repeater which is judged to be an arrangement error since the repeater overlaps with the functional macro 27 or blocks. An individual identifying information name called an instance name or a component name typically used in the netlist is added when the repeater cell is inserted. Then, it is possible to check if the instance name or the component name detected as the arrangement error in step S3 coincides with the individual identifying information name of the repeater cell, so as to be able to easily detect the arrangement error.

It is judged if the arrangement error of the provisionally-arranged repeater judged in step S3 is due to the overlapping with the functional macro 27 (step S4). When there is no arrangement error due to the overlapping with the functional macro 27, the state of being provisionally arranged can be decided as the actual arrangement to complete the processing (step S5).

On the other hand, when there is an arrangement error due to the overlapping with the functional macro 27, the individual identifying information and the logic cell information used in the typical netlist of the start point logic cell 20 connected to an input terminal of the repeater 24 and the end point logic cell 21 connected to an output terminal of the repeater 25 where the arrangement error is occurred are extracted, and the extracted information is temporarily stored in a storage means (RAM) (step S6). Then, the logic cell type 60 that coincides with the logic cell information of the logic cell connected to the net name is searched from the logic information table 10, and the logic cell/repeater discriminant 63 of the logic cell type 60 that coincides with the logic cell information is read out. At this time, when the logic cell connected to the net name is not a repeater, it is possible to judge the logic cell as the start point logic cell 20 and the end point logic cell 21.

Next, the repeater search area 30 shown in FIG. 3 is set to re-arrange the repeaters 24 and 25 where the arrangement error is occurred due to the overlapping with the functional macro 27 (step S7). The repeater search area 30 creates grids in a lattice pattern, each grid having such a size that the repeater candidate having the maximum size 62 in the logic information table 10 can be arranged. Next, the free area information of the free area in which repeaters can be arranged is added to the grid, so as to create the repeater arrangement possible area as shown in FIG. 3 (step S8). The free area information of the free area in which repeaters can be arranged extracts from the grid the size of the area in which the block is not provisionally arranged and adds the extracted size to each grid.

Next, the drive ability of the start point logic cell 20 is read out from the logic information table 10 to set the drive boundary 40 which is the boundary of the area driven by the start point logic cell 20 (step S9). The drive ability of the start point logic cell 20 can be searched from the drive ability 61 of the logic cell type that is obtained by searching the logic cell type 60 that coincides with the start point logic cell 20 from the logic information table 10. In this example, the drive ability that is able to drive the wiring load corresponding to one grid is defined as "1", and the number recited in the drive ability 61 of the logic information table 10 indicates the number of wiring loads (grids) that can be driven.

For example, when the logic of FUN02 is arranged in the start point logic cell 20 shown in FIG. 3, FUN02 is searched from the logic cell type 60 in the logic information table 10 and the drive ability of FUN02 that is searched is referred, so that the drive ability "6" of FUN02 can be obtained. In this case, FUN02 arranged in the start point logic cell 20 is able to drive the wiring load of six grids. Accordingly, the boundary obtained by connecting the coordinate (g, K) and the coordinate (a, E) can be set to the drive boundary 40. Specifically, the coordinate (g, K) is away from the coordinate (a, K) where the start point logic cell 20 is arranged by six grids in the horizontal axis direction within the repeater search area 30, and the coordinate (a, E) is away from the coordinate (a, K) by six grids in the vertical axis direction.

When a Manhattan distance which is an existing technique is used, the number of grids from the coordinate (a, K) where the start point logic cell 20 is arranged to each grid contacting with the drive boundary 40 is always six. For example, to reach the coordinate (d, H), the total number of grids is six, including three grids from the coordinate (a, K) where the start point logic cell 20 is arranged to the coordinate (d, K) and three grids from the coordinate (d, K) to the coordinate (d, H).

The repeater candidate is provisionally arranged as follows. First, the free area information added in step S8 is read out from a grid which is in the area from the start point logic cell 20 to the drive boundary 40 set in step S9, so as to search the repeater candidate that can be arranged in the grid where there is a free area (step S10). When the repeater candidate is detected (step S11), the repeater candidate is provisionally arranged in the detected grid, and the arrangement position information 11 stores the information of the logic cell type 60 of the repeater and the coordinate of the repeater that is arranged (step S13). Further, it is judged if there is another repeater candidate (step S14). When there is another repeater candidate, the repeater candidate is provisionally arranged again, and the arrangement position information 11 stores the coordinate of the repeater candidate that is arranged and the information of the logic cell type 60 of the repeater candidate (step S13). Step S13 and step S14 are repeated until when there is no repeater candidate.

When there is no repeater candidate, it is judged whether the drive boundary 40 reaches the end point logic cell 21 (step S15). Whether the drive boundary 40 reaches the end point logic cell 21 can be judged by determining whether it is possible to search the coordinate (j, A) where the end point logic cell 21 is arranged as shown in FIG. 6 within the area surrounded by the repeater candidate arrangement position 52 and the drive boundary 43 (shown by dotted line). When the drive boundary 40 does not reach the end point logic cell 21, the repeater candidate arranged in step S13 is sequentially set to the start point cell (step S16), and then the processing from step S7 to step S15 is repeated until when the drive boundary reaches the end point logic cell 21.

Further, when the repeater candidate is not detected in step S11, or when there is no repeater candidate, the drive boundary 40 is enlarged by one grid in the side of the end point logic cell 21 as shown in FIG. 4, so as to newly create the drive boundary 41 (step S12). Then, the repeater candidate is searched again in the area of the enlarged drive boundary 41 and the start point logic cell 20 (step S10). Steps S10, S11, and S12 are repeated until when the repeater candidate is detected. The drive boundary 40 is enlarged on the side of the end point logic cell 21 by one grid within the repeater search area 30.

In step S15, when the drive boundary 40 reaches the end point logic cell 21, the total value of the delay time is calculated (step S17). More specifically, the position of the repeater candidate that is provisionally arranged in step S13 is read out from the arrangement position information 11, the delay time from the start point logic cell 20 to the end point logic cell 21 is calculated, and the delay time information and the arrangement information of the repeater candidate are output to the repeater candidate data storage means 12 (step S17). The delay time from the start point logic cell 20 to the end point logic cell 21 can be calculated by reading out the arrangement position and the logic cell type 60 of the repeater connected to the output of the start point logic cell 20 from the arrangement position information 11 using the delay time 64 of the logic information table 10 from the grid where the repeater is arranged.

Next, it is judged if there is no other route from the start point logic cell 20 to the end point logic cell 21 extracted from step S7 to step S15 (step S18). When there is another route, the process goes back to step S17 to repeat calculating of the delay time when the other route is taken and outputting the delay time information and the arrangement coordinate of the repeater candidate to the repeater candidate data storage means 12.

On the other hand, when there is no other route, the delay time in each route stored in the repeater candidate data storage means 12 is read out and the route that makes the delay time the fastest is selected, so as to determine the repeater arrangement (step S19). The delay time in each route calculated in step S19 is stored in the repeater candidate data storage means 12, each delay time is read out to select the route that makes the delay time the fastest, thereby completing the processing.

Figure 9:
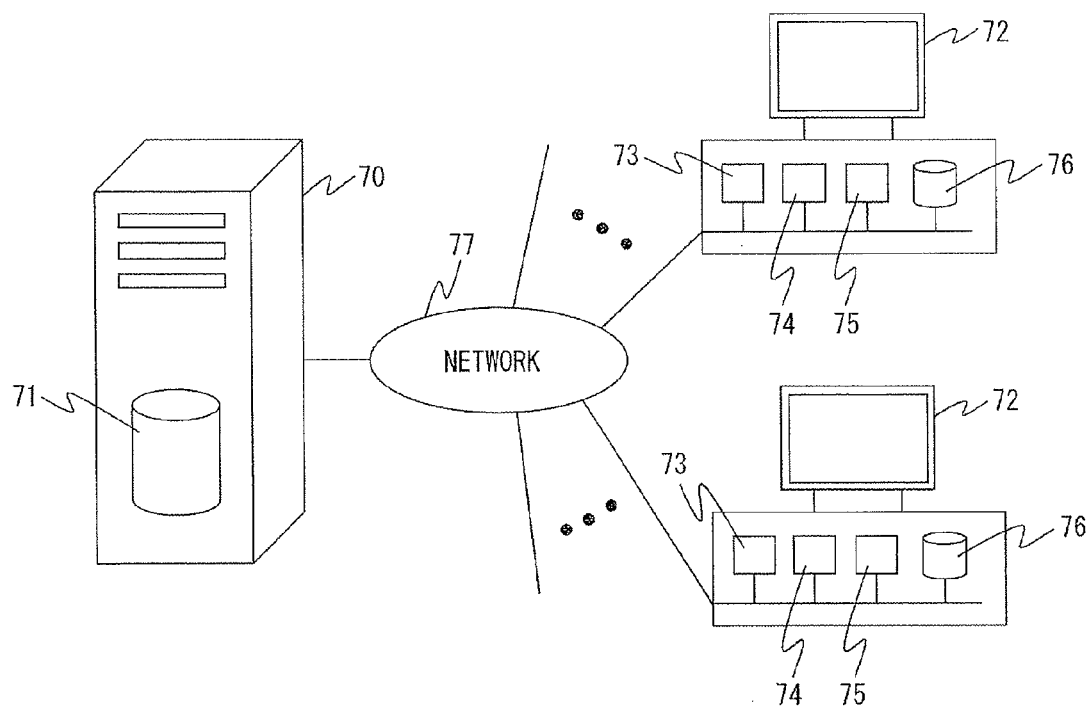
FIG. 9 is a diagram for describing a system configuration for executing the design method of the semiconductor integrated circuit according to the first exemplary embodiment.

Next, a system configuration for achieving the design method of the semiconductor integrated circuit according to the first exemplary embodiment will be described with reference to FIG. 9. As shown in FIG. 9, the system for achieving the design method of the semiconductor integrated circuit according to the first exemplary embodiment includes a computer device 72, a server 70, a storage medium 71, and a network 77.

The computer device 72 includes a CPU 73 that executes a program, a ROM 74 that stores a program for starting up and controlling the computer device, a RAM 75 that loads the program stored in a hard disc device or the like, and a hard disc device 76 that locally stores data and so on. The server 70 includes the storage medium 71 storing the execution program. The server 70 is connected to the computer device 72 such as an engineering work station through the network 77 such as the Internet.

The program for executing the design method of the semiconductor device according to the first exemplary embodiment is stored, for example, in the storage medium 71 of the server 70. The execution program is then downloaded to the computer device 72 from the server 70 through the network 77. The execution program that is downloaded is stored in the local hard disc device 76, the RAM 75 or the like of the computer device 72, so as to perform the execution processing.

As described above, in the design method of the semiconductor integrated circuit according to the first exemplary embodiment, the area surrounded by apices of opposing corners of the position of the start point logic cell and the position of the end point logic cell is set to the repeater search area for re-arranging the provisionally-arranged repeater on the macro. Further, the drive boundary, which is the boundary in an area which can be driven by the drive ability of the start point logic cell, is set in the repeater search area, and the repeater arrangement position is searched. Hence, the repeaters can be arranged in the positions to make the signal wiring route between the start point logic cell and the end point logic cell the shortest, thereby making it possible to suppress an increase of the wiring delay and an occurrence of a timing error. Further, since there is no timing error, the time required to correct the timing error can be omitted.

Further, in the design method of the semiconductor integrated circuit according to the first exemplary embodiment, the drive boundary is set according to the drive ability of the start point logic cell, and the repeater candidate is searched within the area of the drive boundary. When the free area where the repeaters can be arranged is found, the processing of arranging the repeater corresponding to the size of the free area is continued from the start point logic cell to the end point logic cell. As stated above, since the optimization processing of the delay time between the start point logic cell and the end point logic cell is executed in the repeater arrangement, the time required for performing optimization processing of the delay time after the repeater arrangement can be reduced.

Furthermore, in the design method of the semiconductor integrated circuit according to the first exemplary embodiment, the repeater search area surrounding the position of the start point logic cell and the position of the end point logic cell as apices of opposing corners can be enlarged (see step S12). Accordingly, the search area of the repeater candidate can be enlarged, and the arrangement position can be flexibly determined even when it is difficult to arrange the repeaters due to wiring congestion.

Next, a circuit design program according to the first exemplary embodiment will be described.

The circuit design program according to the first exemplary embodiment is a program for causing a computer to execute processing of arranging a repeater between the start point logic cell and the end point logic cell, and includes: a process of setting the area surrounded by apices of opposing corners of the position of the start point logic cell and the position of the end point logic cell to the repeater search area; a process of adding free area information of the free area where the repeater can be arranged to the repeater search area; a process of setting the drive boundary which is the boundary of the area in which the start point logic cell is able to drive the wiring load in the repeater search area based on the drive ability of the start point logic cell; a process of searching the repeater candidate that can be arranged in the area of the drive boundary based on the free area information; a process of calculating a delay time from the start point logic cell to the end point logic cell based on the delay time information and the coordinate of the repeater candidate that is searched; and a process of determining a repeater arranged between the start point logic cell and the end point logic cell from among the repeater candidates based on the calculated delay time.

Further, the circuit design program according to the first exemplary embodiment may cause the computer to execute: a process of resetting the area surrounded by apices of opposing corners of the position of the start point and the position of the end point logic cell as the repeater search area, the start point being the position of the repeater candidate that is searched; a process of again adding the free area information of the free area where a repeater can be arranged to the repeater search area that is reset; a process of resetting the drive boundary which is the boundary of the area where the repeater candidate which is the start point is able to drive the wiring load in the repeater search area that is reset based on the drive ability of the repeater candidate which is the start point; and a process of again searching the repeater candidate that can be arranged in the area of the drive boundary that is reset based on the free area information.

According to the circuit design program of the first exemplary embodiment, repeaters can be arranged in the positions to make the signal wiring route between the start point logic cell to the end point logic cell the shortest, thereby suppressing an increase in a wiring delay and an occurrence of a timing error.

Second Exemplary Embodiment

Hereinafter, a second exemplary embodiment of the present invention will be described with reference to the drawings.

Figure 10:
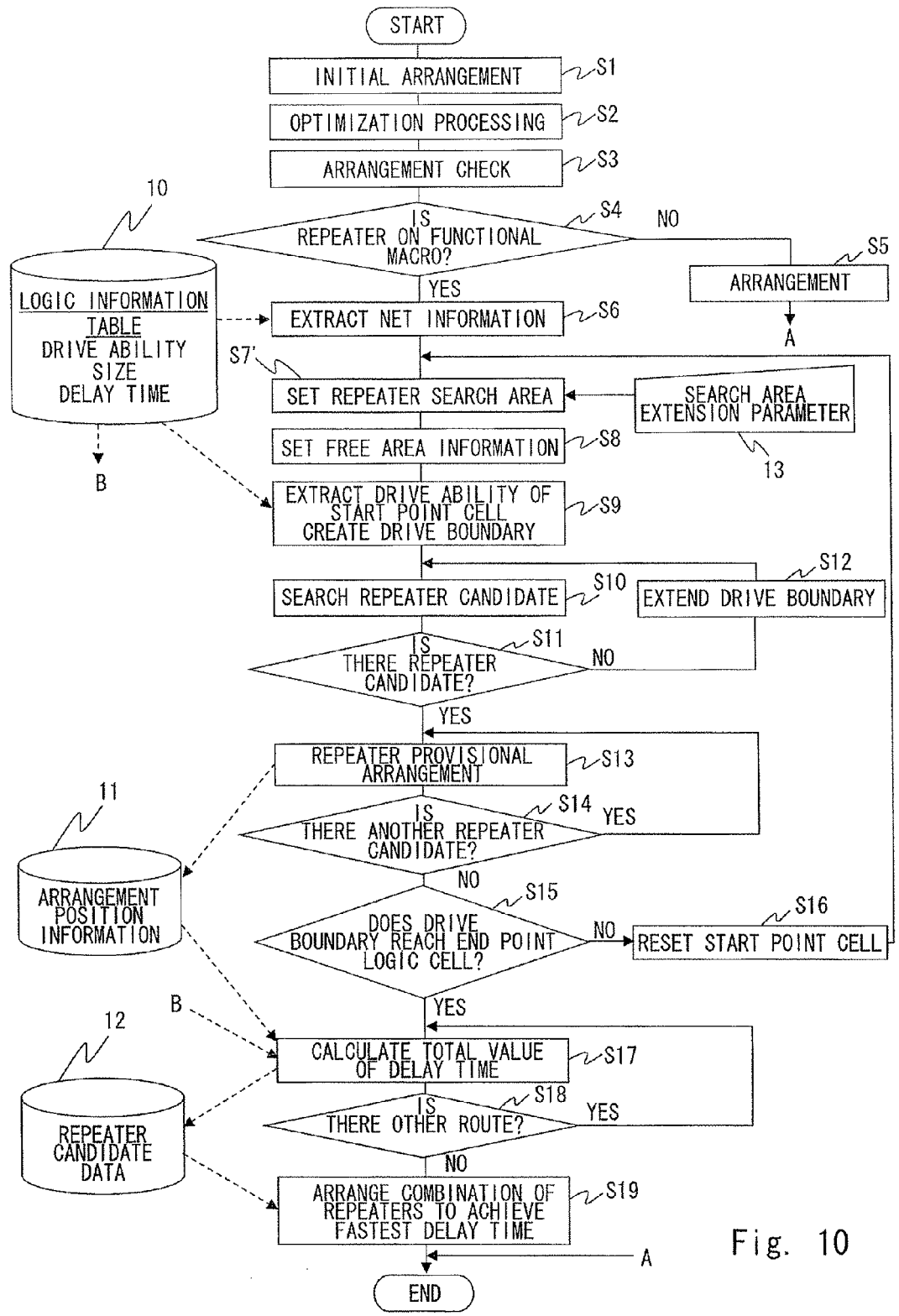
FIG. 10 is a flow chart for describing a design method of a semiconductor integrated circuit according to a second exemplary embodiment.
Figure 13:
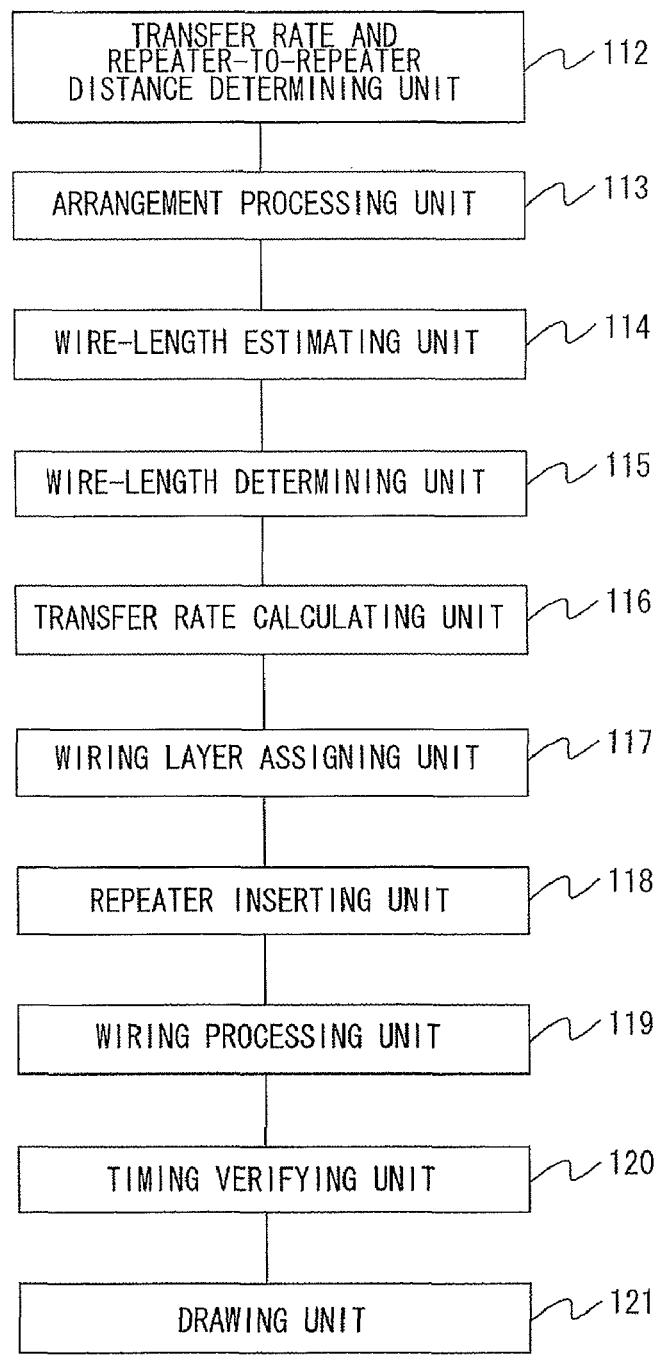
FIG. 13 is a block diagram showing a configuration of an automatic-arrangement-wiring apparatus according to a related art.
Figure 14:
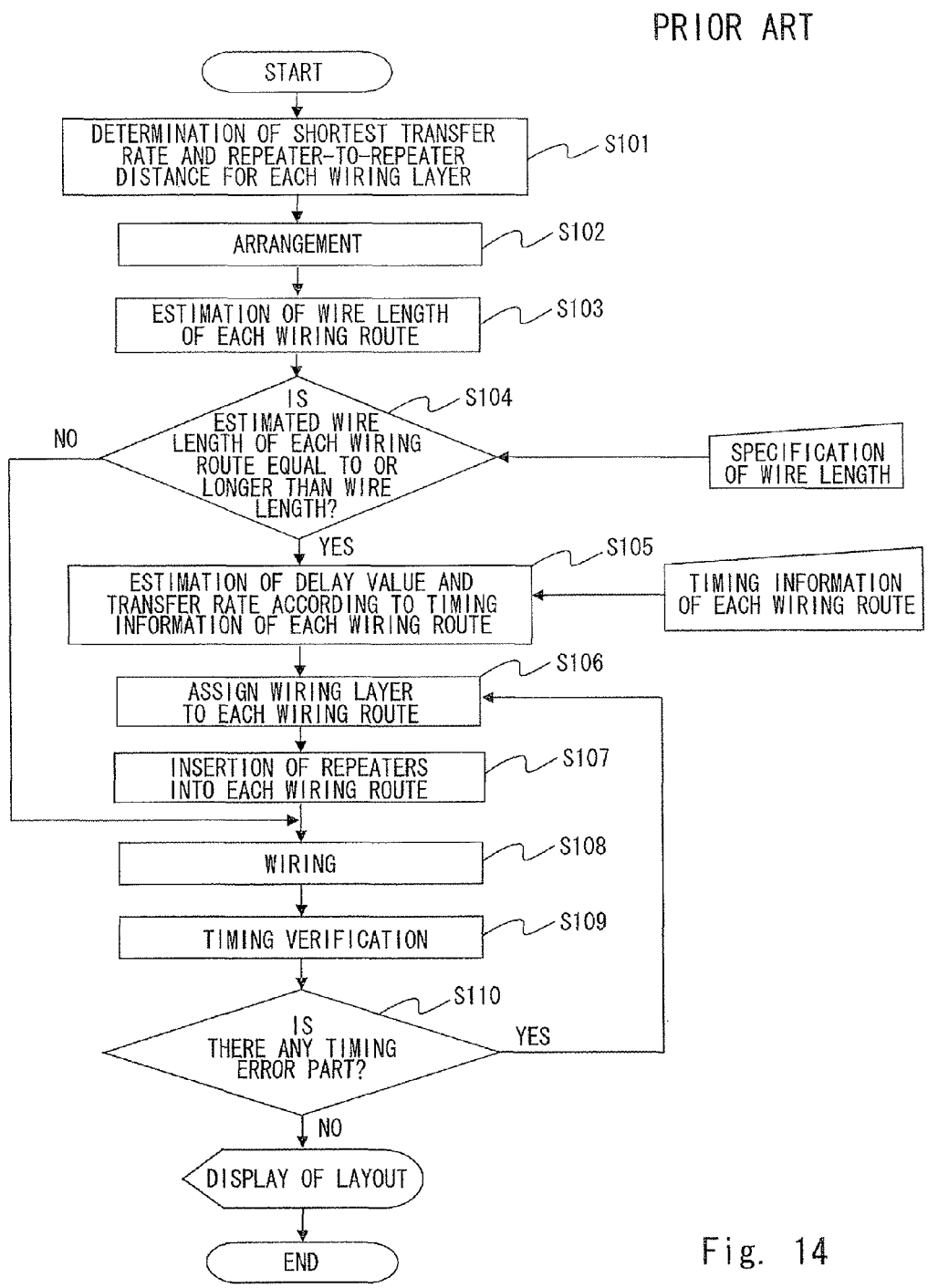
FIG. 14 is a flow chart for describing an operation of the automatic-arrangement-wiring apparatus according to the related art.

FIG. 10 is a flow chart for describing a design method of a semiconductor integrated circuit according to the second exemplary embodiment of the present invention. In the flow chart shown in FIG. 10, the step S7 in the flow chart shown in FIG. 1 is changed to step S7'. In the step S7' in the flow chart shown in FIG. 10, a search area extension parameter 13 is externally input, so as to extend the repeater search area. The other processing is similar to that shown in FIG. 1, and thus description will be omitted.

FIG. 11 is a diagram for describing a case in which the repeater arrangement possible area is extracted using the design method of the semiconductor integrated circuit according to the second exemplary embodiment. FIG. 11 shows the repeater arrangement possible area from the arrangement state of the start point logic cell 20, the end point logic cell 21, the functional macro 27, and the arrangement inhibiting areas 22 and 23 shown in FIG. 2.

Specifically, in the design method of the semiconductor integrated circuit according to the second exemplary embodiment, as shown in FIG. 11, grids of A to M in the vertical direction and a to l in the horizontal direction are created in a lattice pattern, and free area information of the free area in which the repeater candidate having the repeater function in the logic information table 10 shown in FIG. 8 can be arranged is indicated by a numeral for each grid. Note that the methods of setting the size of the grid, the numeral indicating the free area information in each grid, and a drive boundary 45, and of selecting the logic cell type of the repeater that can be arranged in repeater candidate arrangement positions 56 and 57 are similar to those in the first exemplary embodiment, and thus the description thereof will be omitted.

A repeater search area (shown by dashed line) 34 is an area obtained by extending the rectangle surrounded by the coordinate (b, L) and the coordinate (k, B) that are apices of opposing corners of the start point logic cell 20 and the end point logic cell 21 by number of grids specified by the search area extension parameter 13 externally input. In FIG. 11, one grid is specified by the search area extension parameter, and the area from the coordinate (a, M) to the coordinate (l, A) is set to the repeater search area 34.

FIG. 12 is a diagram for describing a case of extracting a repeater arrangement possible area using the design method of the semiconductor integrated circuit according to the second exemplary embodiment. FIG. 12 is a diagram obtained by extracting a repeater search area (shown by dashed line) 35 from a repeater candidate arrangement position 57 which is the start point to the end point logic cell 21. The repeater search area 35 shown in FIG. 12 is the area obtained by extending the rectangle surrounded by the coordinate (g, M) and the coordinate (k, B) that are apices of opposing corners of the repeater candidate arrangement position 57 and the end point logic cell 21 by the number of grids specified by the search area extension parameter 13 that is externally input. The repeater search area 35 shown in FIG. 12 sets one grid to the search area extension parameter, and is set by the area from the coordinate (f, N) to the coordinate (l, A). The repeater search area 35 sets the area that makes the route from the repeater candidate arrangement position 57 which is the start point to the end point logic cell 21 the shortest to the search area.

In the repeater candidate arrangement position 57, the repeater of REP08 having the size "8" is selected from the size 62 of the logic information table 10 and is arranged. A drive boundary 46 (shown by dotted line) indicates an area in which the repeater of REP08 arranged in the repeater candidate arrangement position 57 can drive the wiring load.

Next, a flow of the design method of the semiconductor integrated circuit according to the second exemplary embodiment will be described with reference to the flow chart shown in FIG. 10. The processing of steps S1 to step S6, step S8 and the subsequent steps is similar to the processing shown in FIG. 1 described in the first exemplary embodiment, and thus description will be omitted.

In step S7' shown in FIG. 10, the search area extension parameter 13, which is the information for extending the repeater search area, is externally read, so as to set the repeater search area 34 extended as shown in FIG. 11.

As shown in FIG. 11, in step S7', by extending the repeater search area surrounded by the coordinate (b, L) and the coordinate (k, B) which are apices of opposing corners of the start point logic cell 20 and the end point logic cell 21 by one grid, the repeater search area 34 that is extended and surrounded by the coordinate (a, M) and the coordinate (l, A) is set.

In the design method of the semiconductor integrated circuit according to the second exemplary embodiment, in step S7' shown in FIG. 10, the search area extension parameter externally input is read, and the arrangement search area of the repeater is extended by the number of grids specified by the search area extension parameter from the repeater search area surrounding the opposing corners of the start point logic cell and the end point logic cell. Accordingly, the search area of the repeater candidate can be extended, thereby making it possible to flexibly determine the arrangement position even when it is difficult to arrange repeaters due to wiring congestion. The similar effect as the first exemplary embodiment can be achieved also in the design method of the semiconductor integrated circuit according to the second exemplary embodiment.

While the present invention has been described as a configuration of hardware in the above exemplary embodiments, the present invention is not limited to this. The present invention may achieve any processing by causing a CPU (Central Processing Unit) to execute a computer program. The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A design method of a semiconductor integrated circuit for arranging a repeater between a start point logic cell and an end point logic cell, the method comprising a processor programmed to:

setting an area having apices of opposing corners of a position of the start point logic cell and a position of the end point logic cell to a repeater search area;

adding free area information of a free area where a repeater can be arranged to the repeater search area;

setting a drive boundary in the repeater search area based on a drive ability of the start point logic cell, the drive boundary being a boundary of an area in which the start point logic cell is able to drive a wiring load;

searching a repeater candidate that can be arranged in an area of the drive boundary based on the free area information;

calculating a delay time from the start point logic cell to the end point logic cell based on delay time information and a coordinate of the repeater candidate that is searched;

determining a repeater arranged between the start point logic cell and the end point logic cell from the repeater candidate based on the delay time that is calculated;

setting the position of the repeater candidate that is searched to a start point;

resetting an area having apices of opposing corners of the position of the start point and the position of the end point logic cell to a repeater search area;

adding again free area information of a free area where a repeater can be arranged to the repeater search area that is reset;

resetting a drive boundary in the repeater search area that is reset based on a drive ability of the repeater candidate which is the start point, the drive boundary being a boundary of an area in which the repeater candidate which is the start point is able to drive a wiring load; and searching again a repeater candidate that can be arranged in the area of the drive boundary that is reset based on the free area information.

2. The design method of the semiconductor integrated circuit according to claim 1, wherein the repeater search area includes grids divided in a lattice pattern, and a size of the repeater candidate that can be arranged is set in each of the grids as free area information.

3. The design method of the semiconductor integrated circuit according to claim 2, wherein each of the grids is formed so that a repeater candidate having the largest size among repeater candidates can be arranged therein.

4. The design method of the semiconductor integrated circuit according claim 1, wherein the repeater search area is extended based on an extension parameter.

5. The design method of the semiconductor integrated circuit according to claim 1, wherein the drive boundary is reset by enlarging the drive boundary to a side in which the end point logic cell is positioned.

6. The design method of the semiconductor integrated circuit according to claim 1, further comprising judging whether the drive boundary reaches the end point logic cell after the drive boundary is set.

7. The design method of the semiconductor integrated circuit according to claim 1, further comprising:

storing an arrangement coordinate of the repeater candidate and the delay time that is calculated in a storage means; and setting a repeater forming a route to make a combination of the delay time that is stored minimum between the start point logic cell and the end point logic cell.

8. The design method of the semiconductor integrated circuit according to claim 1, further comprising storing a drive ability of the repeater candidate, a size of the repeater candidate, and delay time information of the repeater candidate in a logic information table.

9. A non-transitory computer readable medium that stores a program to cause a computer to execute processing of arranging a repeater between a start point logic cell and an end point logic cell, comprising:

setting an area having apices of opposing corners of a position of the start point logic cell and a position of the end point logic cell to a repeater search area;

adding free area information of a free area where a repeater can be arranged to the repeater search area;

setting a drive boundary in the repeater search area based on a drive ability of the start point logic cell, the drive boundary being a boundary of an area in which the start point logic cell is able to drive a wiring load;

searching a repeater candidate that can be arranged in an area of the drive boundary based on the free area information;

calculating a delay time from the start point logic cell to the end point logic cell based on delay time information and a coordinate of the repeater candidate that is searched;

determining a repeater arranged between the start point logic cell and the end point logic cell from the repeater candidate based on the delay time that is calculated;

setting the position of the repeater candidate that is searched to a start point;

resetting an area having apices of opposing corners of the position of the start point and the position of the end point logic cell to a repeater search area;

adding again free area information of a free area where a repeater can be arranged to the repeater search area that is reset;

resetting a drive boundary in the repeater search area that is reset based on a drive ability of the repeater candidate which is the start point, the drive boundary being a boundary of an area in which the repeater candidate which is the start point is able to drive a wiring load; and searching again a repeater candidate that can be arranged in the area of the drive boundary that is reset based on the free area information.

10. A design method of a semiconductor integrated circuit for arranging a repeater between a start point logic cell and an end point logic cell, the method comprising a processor programmed to:

setting an area having apices of opposing corners of a position of the start point logic cell and a position of the end point logic cell to a repeater search area;

adding free area information of a free area where a repeater can be arranged to the repeater search area;

setting a drive boundary in the repeater search area based on a drive ability of the start point logic cell, the drive boundary being a boundary of an area in which the start point logic cell is able to drive a wiring load, wherein the repeater search area includes grids divided in a lattice pattern, and a size of the repeater candidate that can be arranged is set in each of the grids as free area information and each of the grids is formed so that a repeater candidate having the largest size among repeater candidates can be arranged therein;

searching a repeater candidate that can be arranged in an area of the drive boundary based on the free area information;

calculating a delay time from the start point logic cell to the end point logic cell based on delay time information and a coordinate of the repeater candidate that is searched; and determining a repeater arranged between the start point logic cell and the end point logic cell from the repeater candidate based on the delay time that is calculated.

11. The design method of the semiconductor integrated circuit according to claim 10, wherein the repeater search area is extended based on an extension parameter.

12. The design method of the semiconductor integrated circuit according to claim 10, wherein the drive boundary is reset by enlarging the drive boundary to a side in which the end point logic cell is positioned.

13. The design method of the semiconductor integrated circuit according to claim 10, further comprising judging whether the drive boundary reaches the end point logic cell after the drive boundary is set.

14. The design method of the semiconductor integrated circuit according to claim 10, further comprising:
    storing an arrangement coordinate of the repeater candidate and the delay time that is calculated in a storage means; and
    setting a repeater forming a route to make a combination of the delay time that is stored minimum between the start point logic cell and the end point logic cell.

15. The design method of the semiconductor integrated circuit according to claim 10, further comprising storing a drive ability of the repeater candidate, a size of the repeater candidate, and delay time information of the repeater candidate in a logic information table.

* * * * *